(12) United States Patent
Mukaihara et al.

(10) Patent No.: US 6,472,691 B2
(45) Date of Patent: Oct. 29, 2002

(54) DISTRIBUTED FEEDBACK SEMICONDUCTOR LASER DEVICE

(75) Inventors: Toshikazu Mukaihara; Hitoshi Shimizu; Masaki Funabashi; Akihiko Kasukawa, all of Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/874,278

(22) Filed: Jun. 6, 2001

(65) Prior Publication Data

US 2001/0048111 A1 Dec. 6, 2001

(30) Foreign Application Priority Data

Jun. 6, 2000 (JP) ........................................ 2000-168614
Mar. 27, 2001 (JP) ........................................ 2001-089711

(51) Int. Cl.$^7$ .............................................. H01L 29/74
(52) U.S. Cl. ........................... 257/115; 257/84; 257/98; 257/116; 372/43; 372/44; 372/45; 372/46; 372/96
(58) Field of Search ............................. 372/43, 44, 45, 372/46, 50, 96; 257/84, 98, 115, 116

(56) References Cited

U.S. PATENT DOCUMENTS 5,289,494 A * 2/1994 Tada et al. ..................... 372/96
5,960,023 A * 9/1999 Takahashi ..................... 372/96

FOREIGN PATENT DOCUMENTS

JP          8-195522         7/1996

OTHER PUBLICATIONS

U.S. patent application Ser. No. 09/537,216, filed Mar. 29, 2000, pending.
U.S. patent application Ser. No. 09/676,989, filed Oct. 2, 2000, pending.
U.S. patent application Ser. No. 09/832,885, filed Apr. 12, 2001, pending.
U.S. patent application Ser. No. 09/769,395, filed Jan. 26, 2001, pending.
U.S. patent application Ser. No. 09/793,881, filed Feb. 28, 2001, pending.
U.S. patent application Ser. No. 09/828,144, filed Apr. 9, 2001, pending.
U.S. patent application Ser. No. 09/865,444, filed May 29, 2001, pending.
U.S. patent application Ser. No. 09/874,278, filed Jun. 6, 2001, pending.
U.S. patent application Ser. No. 09/581,179, filed Sep. 12, 2000, pending.
U.S. patent application Ser. No. 09/582,624, filed Aug. 21, 2000, pending.

(List continued on next page.)

*Primary Examiner*—Olik Chaudhuri
*Assistant Examiner*—Wai-Sing Louie
(74) *Attorney, Agent, or Firm*—Oblon, Spivak, McClelland, Maier & Neustadt, P.C.

(57) ABSTRACT

A DFB semiconductor laser device including: a semiconductor substrate; and an active layer and a diffraction grating overlying the semiconductor substrate, the diffraction grating having a composition of GaInNAs(Sb) and absorbing light having a laser emission wavelength of the active layer. The DFB semiconductor laser device having a higher SMSR can be provided which stably operates in a wider range of injection current by proving the diffraction grating formed by the GaInNAs(Sb) having the composition for efficiently absorbing light which has the laser emission wavelength of the active layer.

7 Claims, 6 Drawing Sheets

OTHER PUBLICATIONS

U.S. patent application Ser. No. 09/811,454, filed Mar. 20, 2001, pending.
U.S. patent application Ser. No. 09/874,278, filed Jun. 6, 2001, pending.
U.S. patent application Ser. No. 09/874,278, filed Jun. 6, 2001, pending.
U.S. patent application Ser. No. 09/987,536, filed Nov. 15, 2001, pending.
U.S. patent application Ser. No. 10/015,656, filed Dec. 17, 2001, pending.
U.S. patent application Ser. No. 09/874,278, filed Jun. 6, 2001, pending.
U.S. patent application Ser. No. 09/983,249, filed Oct. 23, 2001, pending.
U.S. patent application Ser. No. 09/983,175, filed Oct. 23, 2001, pending.
U.S. patent application Ser. No. 09/930,130, filed Aug. 16, 2001, pending.

* cited by examiner

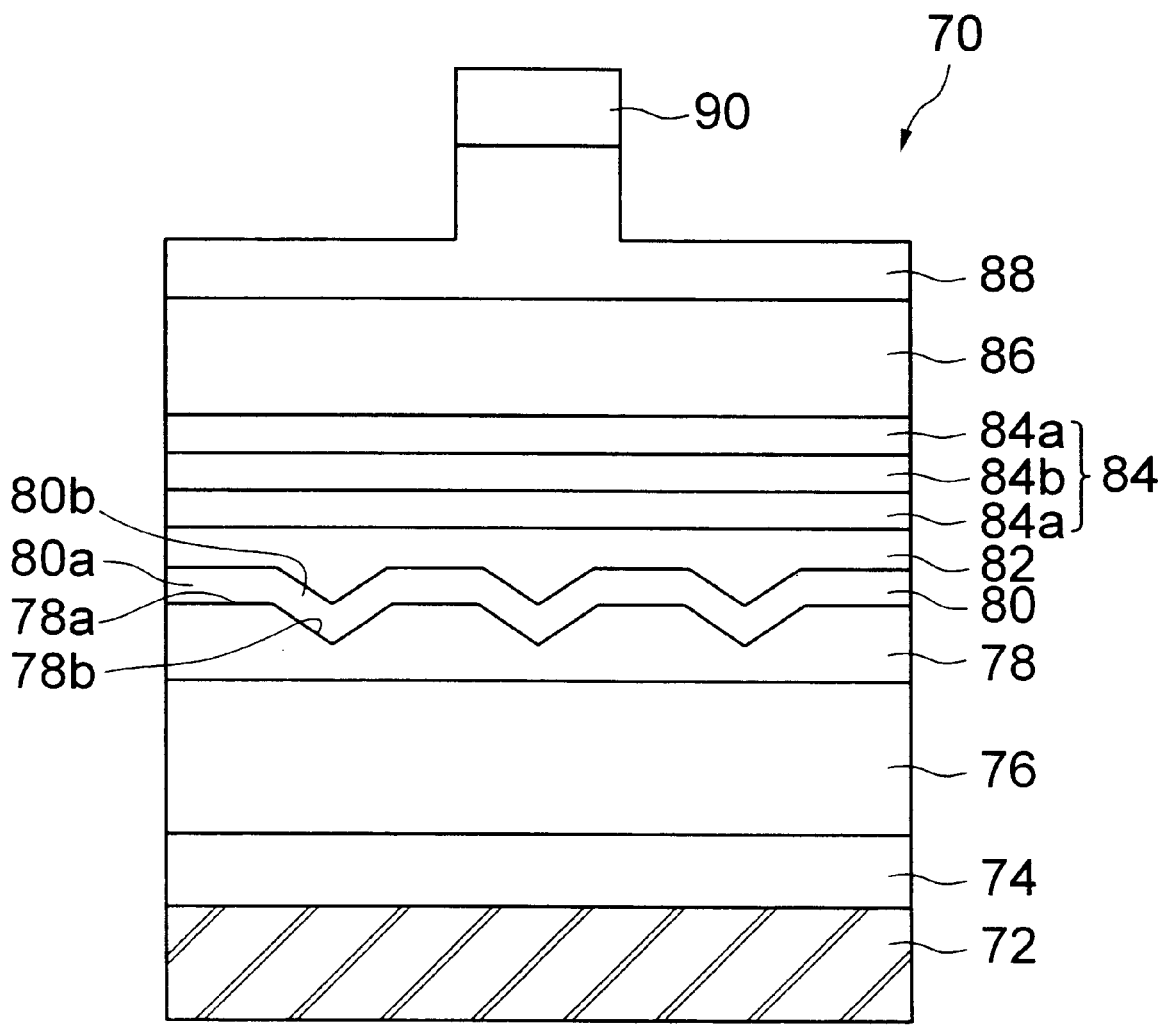

DISTRIBUTED FEEDBACK SEMICONDUCTOR LASER DEVICE

BACKGROUND OF THE INVENTION (a) Field of the Invention

The present invention relates to a distributed feedback (DFB) semiconductor laser device having a longer wavelength band between 0.9 and 1.65 μm frequently used as a light source for optical communication, more in detail to the DFB semiconductor laser device having a stable emission wavelength and being operatable at a single wavelength especially suitable for exciting an optical fiber amplifier or a Raman amplifier, and to the Peltier-fee DFB semiconductor laser device having smaller temperature dependency.

(b) Description of the Related Art

A DFB semiconductor laser device has a stable laser emission wavelength and is operated at a single wavelength especially suitable for use in wave-lenght-multiplexing (WDM) systems and high-bit-rate transmission and so on.

As the first conventional example, the configuration of a 980 nm-band InGaAs-based semiconductor laser device used as an excitation light source for an optical fiber amplifier will be described.

The semiconductor laser device which is a conventional Fabry-Perot semiconductor laser device includes a stacked structure having an n-AlGaAs cladding layer, an InGaAs/GaAs quantum well layer, a p-AlGaAs cladding layer having a thickness of 2 μm and a p-GaAs capping layer sequentially stacked on an n-GaAs substrate having a thickness of 100 μm.

The top portion of the p-AlGaAs cladding layer and the p-GaAs capping layer in the stacked structure include mesa stripes having a thickness of 4 μm.

An SiN passivation films is formed on the p-AlGaAs cladding layer and on the sidewalls of the mesa structure excluding the top surface of the p-GaAs capping layer.

A Ti/Pt/Au stacked metal film acting as a p-electrode is deposited on the top surface of the p-GaAs capping layer and the SiN passivation film, and an AuGe/Ni/Au stacked metal film acting as an n-electrode is deposited on the bottom surface of the substrate.

A cavity length is 100 μm. An anti-reflection(AR) film having a reflection rate of 7% is formed on the front cleavage facet, and a higher reflection (HR) film having a reflection rate of 95% is formed on the rear cleavage facet.

The excitation wavelength of an Er (erbium) doped fiber amplifier attracting attention in these days is generally 980 nm, and the window of the excitation wavelength is extremely low in view of the excitation efficiency.

The 980 nm semiconductor laser used as the excitation optical source is desirably stable in wide ranges of temperature and injected current and operates at an emission wavelength of 980 nm. Further, in view of the excitation efficiency, the emission spectrum characteristic is desirably a single mode rather than a multiple mode.

Accordingly, a refractive index-coupled DFB laser having the single mode spectrum characteristic and stably operating in spite of the change of an operating circumstance is more important than the Fabry-Perot type laser operating with a multi-mode.

A refractive index-coupled DFB laser of a second conventional example includes a stacked structure having an n-AlGaAs cladding layer, an InGaAs/GaAs quantum well layer, a GaAs waveguide layer, a p-AlGaAs cladding layer having a thickness of 2 μm and a p-GaAs capping layer sequentially stacked by using an MOCVD method on an n-GaAs substrate.

A diffraction grating having a cycle of 140 nm is formed on the GaAs waveguide layer by using electronbeam lithography.

The top portion of the p-AlGaAs cladding layer and the p-GaAs capping layer in the stacked structure include mesa stripes having a thickness of 4 μm.

Similarly to the previous semiconductor laser device, an SiN passivation film is formed on the p-AlGaAs cladding layer and on the sidewalls of the mesa structure excluding the top surface of the p-GaAs capping layer, and a p-electrode and an n-electrode are formed.

A cavity length is 1000 μm. An anti-reflection(AR) film having a reflection rate of 7% is formed on the front cleavage facet, and a higher reflection (HR) film having a reflection rate of 95% formed is on the rear cleavage facet.

The spectrum characteristics of the DFB laser were examined. The optical strength ratio called a side mode suppression ratio (SMSR) between a main emission mode "a1" and a side mode "a2" was relatively excellent, that is, 30 dB when injection current was 200 mA.

However, in the spectrum characteristics at the injection current of 400 mA, the two-mode emission (or mode skipping) was observed and the SMSR was reduced below 10 dB.

The spectrum stability of the DFB laser of the second conventional example was not high.

A GaInAsP-based semiconductor laser having a wavelength of a 1.3 μm band or a 1.55 μm band formed on an InP substrate has been generally used as an optical source in the field of optical communication.

The GaInAsP-based semiconductor laser includes a problem that a temperature characteristic of a threshold value or a characteristic temperature "To" which is a factor showing the temperature dependency of the threshold value is as low as 50 to 70 K. In other words, the temperature dependency is worse and a cooling device such as a Peltier device is required.

Further, in the DFB laser having a wavelength of a 1.3 μm band or a 1.55 μm band used for an optical source for CATV and so on in addition to a module for domestic transmission, the miniaturization and the lower power consumption are demanded and a semiconductor laser with excellent temperature characteristic is required operating at a higher wavelength band without a cooling device such as a Peltier free device.

As described in the second conventional example, the range of realizing the single mode is narrow and the DFB laser is unstable to external reflection rays. The yield of the DFB having the excellent spectrum characteristics is low.

Although an absorption type DFB laser having a higher yield has been demanded, a GaInAs layer having a thickness of about 50 nm and an In content of about 30% is necessary as an absorption layer for absorbing an emission wavelength of a GaInAs/GaAs active layer for realizing the absorption type DFB laser.

However, due to the lattice-mismatching, the GaInAs layer having the In content of about 30% and thickness of about 50 mm can be hardly grown with the higher quality crystal growth.

SUMMARY OF THE INVENTION

In one aspect of the present invention, a DFB semiconductor laser device is provided which includes: a semiconductor substrate; and an active layer and a diffraction grating overlying the semiconductor substrate, the diffraction grating having a composition of GaInNAs(Sb) and absorbing light having a laser emission wavelength of the active layer (hereinafter referred to as "first invention").

In accordance with the first invention, the DFB semiconductor laser device having a higher side mode suppression ratio can be provided which stably operates in a wider range of injection current when external reflection light is incident by proving the diffraction grating formed by the GaInNAs (Sb) having the composition for efficiently absorbing light which has the laser emission wavelength of the active layer.

In another aspect of the present invention, a DFB semiconductor laser device is provided which includes: a GaAs substrate; a quantum well structure including a GaInNAs (Sb) quantum well layer acting as an active layer; and an absorption layer including a diffraction grating made of GaInNAs(Sb) having a band-gap energy which is lower than that of the GaInNAs(Sb) quantum well layer (hereinafter referred to as "second invention").

In a further aspect of the present invention, a DFB semiconductor laser device is provided which includes: a a GaAs substrate; a quantum well structure including a GaInNAs(Sb) quantum well layer acting as an active layer; and an absorption layer including a diffraction grating made of GaInNAs(Sb) having a band-gap energy which is larger than that of the GaInNAs(Sb) quantum well layer by 40 meV or less (hereinafter referred to as "third invention").

In accordance with the second and the third inventions, the gain coupled-type DFB semiconductor laser device having the absorption wavelength band of 0.9 to 1.65 $\mu$m can be provided which operates at a higher single mode and has a higher temperature performance, a higher product yield and no Peltier effect. The DFB laser device can be realized by forming the absorption layer of the diffraction grating by the GaInNAs having the band-gap energy lower than that of the GaInNAs quantum well layer or by the GaInNAs translucent with respect to the laser emission wavelength of the active layer having the band-gap energy somewhat larger than that of the GaInNAs quantum well layer.

In these inventions, a similar effect can be obtained when the GaInNAsSb is used in place of the GaInNAs.

The above and other objects, features and advantages of the present invention will be more apparent from the following description.

BRIEF DESCRIPTION OF DRAWINGS

FIG. 3 is a vertical sectional view showing an absorption-type DFB laser in accordance with an embodiment of a second invention.

PREFERRED EMBODIMENTS OF THE INVENTION

Then, the configuration of a semiconductor laser device of an embodiment in accordance with the first invention will be described referring to FIG. 1 and FIGS. 2A to 2C.

Figure 1:
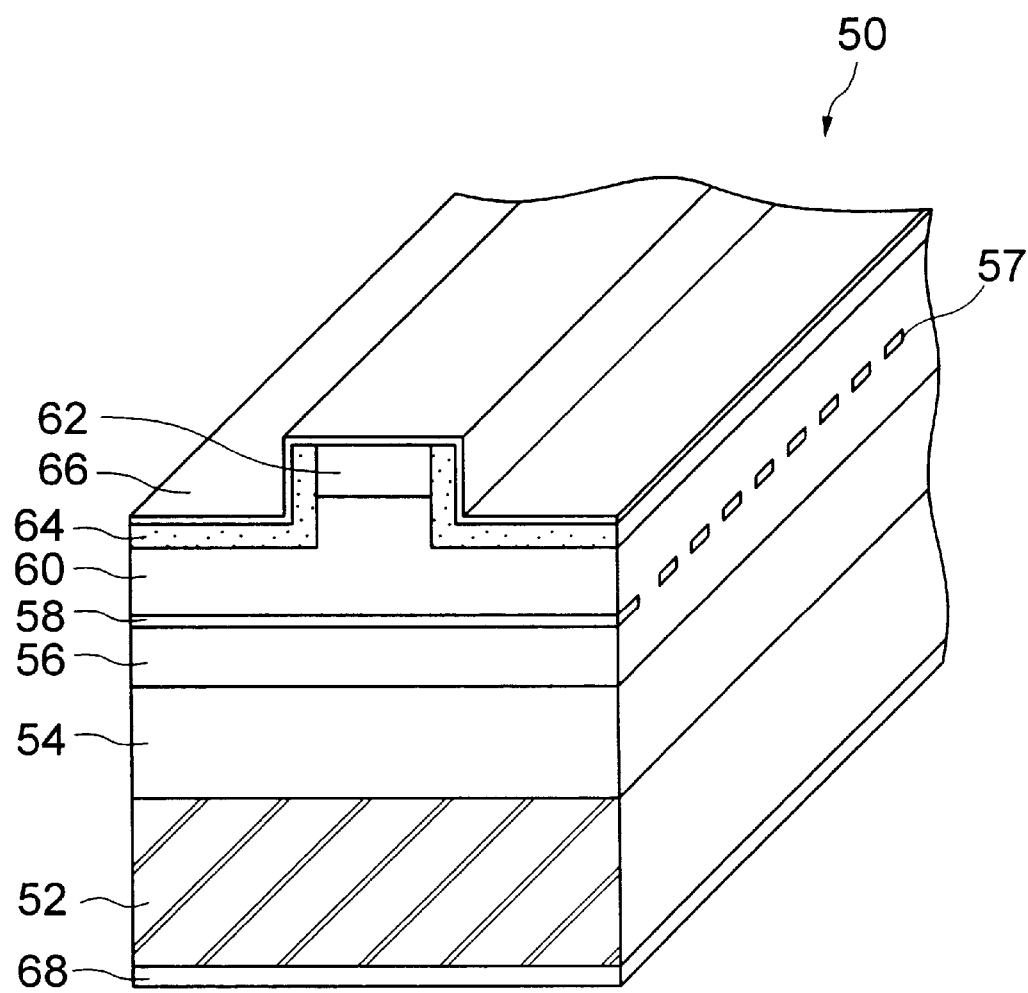
FIG. 1 is a vertical sectional view showing a DFB semiconductor laser device in accordance with an embodiment of a first invention.

As shown in FIG. 1, a semiconductor laser device 50 is a ridge waveguide and absorption-type distributed feedback semiconductor laser device (DFB laser) and includes a stacked structure obtained by sequentially depositing an n-AlGaAs cladding layer 54 having a thickness of 2 $\mu$m, an InGaAs/GaAs quantum well structure layer 56, a GaInNAs absorption layer 58 having a diffraction grating 57, a p-AlGaAs cladding layer 60 having a thickness of 2 $\mu$m and a GaAs capping layer 62 having a thickness of 0.3 $\mu$m overlying an n-GaAs substrate 52 having a thickness of 100 $\mu$m.

The GaInNAs absorption layer 58 containing 6% of In and 2% of N has a composition that is lattice-matched with GaAs substrate, and the diffraction grating 57 having a cycle of 140 nm are disposed in the GaInNAs absorption layer 58.

In the stacked structure, the top portion of the p-AlGaAs cladding layer 60 and the GaAs capping layer are processed to have mesa stripes having a width of 4 $\mu$m.

An SiN passivation film 64 is formed on the p-AlGaAs cladding layer 60 and the sidewalls of the mesa stripes except for the top surface of the p-GaAs capping layer 62.

A p-side electrode 66 made of a Ti/Pt/Au stacked metal film is formed on the top surface of the p-GaAs capping layer 62 and the SiN passivation film 64, and an n-side electrode 68 made of an AuGe/Ni/Au stacked metal film is formed on the bottom surface of the n-GaAs substrate 52.

A cavity length is 1500 $\mu$m. An anti-reflection(AR) film having a reflection rate of 1% not shown in the drawings is formed on the front cleavage facet, and a higher reflection film (HR) having a reflection rate of 95% not shown in the drawings is formed on the rear cleavage facet.

Then, a method for fabricating the absorption-type DFB laser 50 of the embodiment will be described referring to FIGS. 2A to 2C.

Figure 2A:
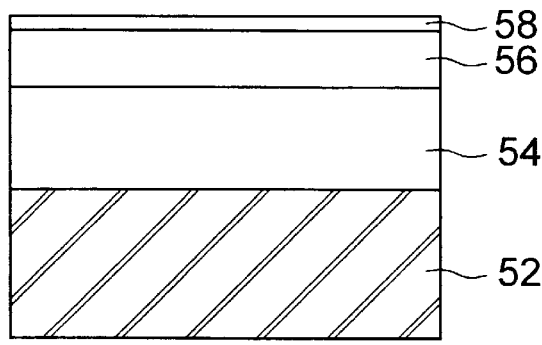
FIGS. 2A to 2C are vertical sectional views sequentially showing a method for fabricating the DFB semiconductor laser device of FIG. 1.

As shown in FIG. 2A, the n-AlGaAs cladding layer 54 having the thickness of 2 $\mu$m, the InGaAs/GaAs quantum well structure layer 56, the GaInNAs absorption layer 58 having an In content of 6% and an N content of 2% are sequentially formed overlying the n-GaAs substrate 52 by using the MOCVD method.

Since the GaInNAs absorption layer 58 includes the above composition that is lattice-matched with the GaAs substrate, the GaInNAs absorption layer 58 without the crystal deficiency can be epitaxially grown.

Figure 2B:
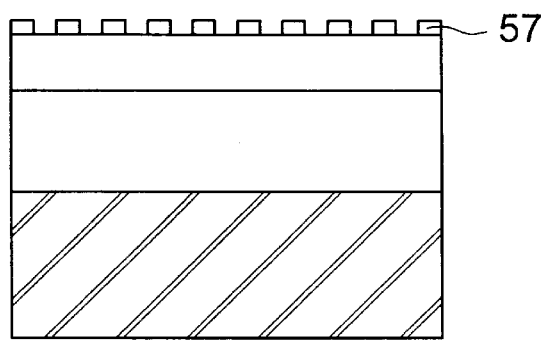

Then, after a pattern (not shown) for the diffraction grating 57 having a period (P) of 140 nm is formed on the GaInNAs absorption layer 58 by using an electron-beam lithography technology, the diffraction grating 57 is formed by etching the GaInNAs absorption layer 58 other than the region for the diffraction grating 57, as shown in FIG. 2B.

Figure 2C:
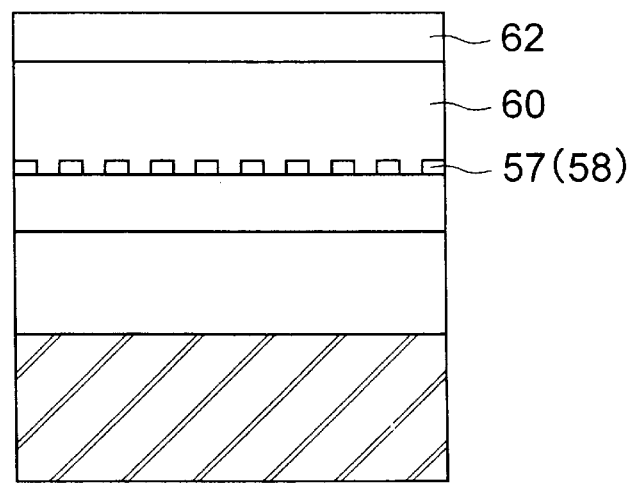

As shown in FIG. 2C, the p-AlGaAs cladding layer 60 having the thickness of 2 $\mu$m and the p-GaAs capping layer 62 having the thickness of 0.3 $\mu$m are sequentially deposited on the GaInNAs absorption layer 58 having the diffraction grating 57 by using the MOCVD method.

Then, as shown in FIG. 1, the p-GaAs capping layer 62 and the top portion of the p-AlGaAs cladding layer 60 are etched to form the mesa stripes having the width of 4 $\mu$m.

After the formation of the SiN passivation film 64 on the p-GaAs capping layer 62 and the top portion of the p-AlGaAs cladding layer 60, the SiN passivation film 64 on the mesa stripes is removed to expose the top surface of the p-GaAs capping layer 62.

After the bottom surface of the n-GaAs substrate 52 is polished to adjust the thickness to 100 $\mu$m, the Ti/Pt/Au stacked metal film is deposited on the p-GaAs capping layer 62 and the SiN passivation film 64 to form the p-side electrode 66, and the AuGe/Ni/Au stacked metal film is deposited on the bottom surface of the n-GaAs substrate 52 to form the n-side electrode 68.

After the cleavage to the bars having the cavity length of 1500 μm, the AR film having the reflection rate of 1% is deposited on the front cleavage facet, and the HR (higher reflection) film having the reflection rate of 95% is deposited on the rear cleavage facet. Finally, the bars are chipped.

The protocol semiconductor laser device 50 of the present embodiment was fabricated, and the performance thereof was measured. Threshold current was 50 mA and an optical output efficiency was 0.85 W/A.

The spectrum at the injection current of 700 mA showed the realization of the single mode operation having the side mode suppressing ratio (SMSR) of 40 dB or more and confirmed no mode skipping. The SMSR is a difference between light strengths of a main lasing mode "a1" and a side mode "a2".

The change of the laser emission wavelength with respect to a temperature was about 0.1 nm/K, and the DFB laser was realized which operated at the stable laser emission wavelength acting as the light source for exciting the fiber amplifier. The DFB laser was confirmed to stably operate when external reflection light was incident.

In the present embodiment, the absorption-type DFB laser is realized having the excellent spectrum characteristics by the formation of the diffraction grating 57 formed by the GaInNAs absorption layer 58 absorbing the light having the laser wavelength of the active layer, having the In content of 6% and the N content of 2% and being lattice-matched with the GaAs substrate.

Although the DFB layer including the GaInAs/GaAs quantum well structure layer with the wavelength band of 980 nm is exemplified in the present embodiment, the present invention may be applied to an absorption-type GaInNAs(Sb)-based DFB laser with the laser emission wavelength band of 1200 to 1400 nm having an active layer formed by an GaInNAs(Sb)/GaAs quantum well structure layer.

The "GaInNAs(Sb)" refers to GaInNAs or GaInNAsSb. The addition of the Sb to the GaInNAs improves the crystallinity of the GaInNAs without changing the properties thereof. The adding amount may be extremely small and the Sb content in the GaInNAsSb is, for example, between 0.2 and 3.5% with respect to the group V metals. This may be also applied to the second and the third inventions.

In the first invention, the compositions of the substrate and the active layer are not especially restricted so long as the absorption layer forming the diffraction grating is formed by the GaInNAs or GaInNAsSb having the composition for absorbing the light having the laser emission wavelength of the active layer. In the embodiment of the first invention, the semiconductor substrate is formed by the GaAs, and the active layer is the quantum well structure layer formed by Ga(In)As/(Al)GaAs. The Ga(In)As refers to GaInAs or GaAs, and the (Al)GaAs refers to AlGaAs or GaAs.

Then, the configuration of a semiconductor laser device having a wavelength band of 1300 nm of an embodiment in accordance with the second invention will be described referring to FIG. 3 and FIGS. 4A to 4E.

A DFB semiconductor laser device 70 of the present embodiment is an absorption type-DFB with ridge waveguide.

As shown in FIG. 3, the DFB laser 70 includes a stacked structure obtained by sequentially depositing, by using an MOCVD method, an n-GaAs buffer layer 74 having carrier concentration of $1 \times 10^{18}$ cm$^{-3}$ and a thickness of 0.5 μm, an n-Al$_{0.5}$Ga$_{0.5}$As cladding layer 76 having carrier concentration of $1 \times 10^{18}$ cm$^{-3}$ and a thickness of 2 μm, and a GaAs light confining layer 78 on the (100) plane of an n-GaAs substrate 72 having a thickness of about 100 μm.

The GaAs light confining layer 78 alternately includes a flat surface 78a of (100) plane having a width of about 110 nm and a slanted surface 78b of (111) plane having a depth of about 50 nm and a pitch of about 210 nm. The thickness of the flat surface 78a is about 60 nm.

The DFB laser 70 further includes, on the above stacked structure, another stacked structure obtained by sequentially depositing a GaInAsN bulk layer 80 formed along the flat surface 78a and the slanted surface 78b of the GaAs light confining layer 78, another GaAs light confining layer 82 having a thickness of 50 nm, a GaInAsN/GaAs quantum well structure layer 84 having a laser emission wavelength of 1.3 μm, a further GaAs light confining layer 86 having a thickness of 140 nm, a p-Al$_{0.5}$Ga$_{0.5}$As cladding layer 88 having a thickness of 2 μm, and a p-GaAs contact layer 90 having a thickness of 0.2 μm.

The GaInAsN bulk layer 80 on the flat surface 78a of the GaAs light confining layer 78 becomes a Ga$_{0.93}$In$_{0.07}$As$_{0.975}$N$_{0.025}$ layer 80a having a thickness of 30 nm and a band-gap wavelength of 1.24 μm and being lattice-matched with the n-GaAs substrate. Accordingly, the Ga$_{0.93}$In$_{0.07}$As$_{0.975}$N$_{0.025}$ layer 80a acts as a transparent layer with respect to the light having the laser emission wavelength of 1.3 μm of the active layer.

The GaInAsN bulk layer 80 on the (111)A plane 78b of the GaAs light confining layer 78 becomes a Ga$_{0.93}$In$_{0.07}$As$_{0.965}$N$_{0.035}$ layer 80b having an increased N content. The Ga$_{0.93}$In$_{0.07}$As$_{0.965}$N$_{0.035}$ layer 80b has a tensile strain of 0.2% with respect to the n-GaAs substrate, a band-gap energy smaller than that of the active layer 84 and a band-gap wavelength of 1.38 μm. Accordingly, the layer 80b acts as an absorption layer for the light having a laser emission wavelength of 1.3 μm of the active layer 84.

The GaInAsN/GaAs quantum well structure layer 84 includes a pair of Ga$_{0.63}$In$_{0.37}$Ns$_{0.01}$As$_{099}$ well layers 84a having a thickness of 8 nm and a compressive strain of 2.5% and a GaAs barrier layer 84b having a thickness of 15 nm sandwiched by the well layers 84a. The number of the wells is two.

The top portion of the p-Al$_{0.5}$Ga$_{0.5}$As cladding layer 88 and the p-GaAs contact layer 90 are etched to form mesa stripes having an active layer width of 3 μm.

A p-type ohmic metal film made of Au—Zn or Ti/Pt/Au acting as the p-side electrode not shown in the drawings is formed on the p-GaAs contact layer 90, and a metal film made of Au—Ge/Ni/Au acting as the n-side electrode not shown in the drawings is formed on the bottom surface of the n-GaAs substrate 72.

A cavity length is 300 μm, and both the facets are cleavage surfaces.

Then, a method for fabricating the DFB laser of the embodiment will be described referring to FIGS. 4A to 4E.

Figure 4A:
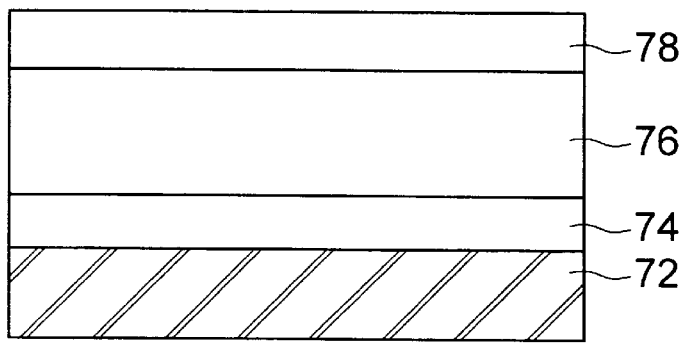
FIGS. 4A to 4E are vertical sectional views sequentially showing a method for fabricating the DFB semiconductor laser device of FIG. 3.

As shown in FIG. 4A, the n-GaAs buffer layer 74 having the carrier concentration of $1 \times 10^{18}$ cm$^{-3}$ and the thickness of 0.5 μm, the n-Al$_{0.5}$Ga$_{0.5}$As cladding layer 76 having the carrier concentration of $1 \times 10^{18}$ cm$^{-3}$ and the thickness of 2 μm, and the GaAs light confining layer 78 having the thickness of 60 nm are epitaxially grown on the (100) plane of the n-GaAs substrate 72 by using one of the MOCVD method, a gas source method, an MBE method and a CBE method.

Figure 4B:
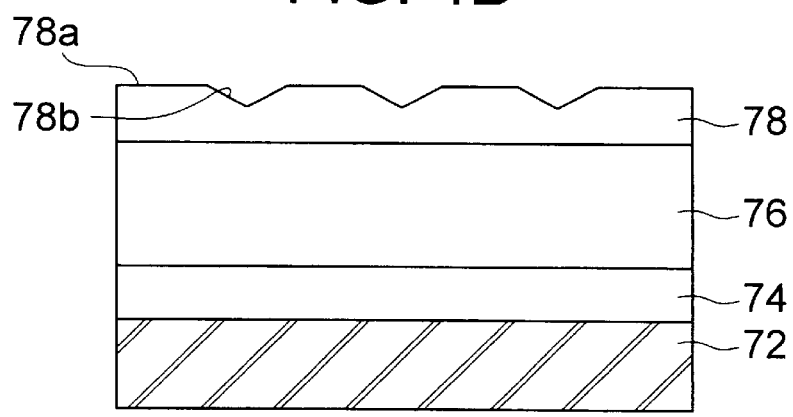

Then, a photoresist film prepared on the GaAs light confining layer 78 is lithographically treated to form an etching mask (not shown). As shown in FIG. 4B, the GaAs light confining layer 78 is etched by using the etching mask to provide the substrate with steps alternately having the flat surface 78a and the slanted surface 78b on the (111)A plane. The pitch and the depth of the slanted surface 78b are 210 nm and about 50 nm, respectively, and the width of the flat surface 78a is about 110 nm.

Figure 4C:
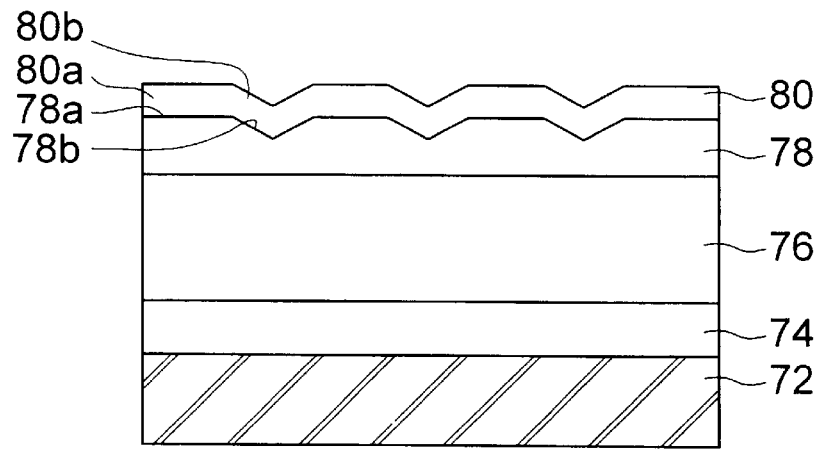

As shown in FIG. 4C, the GaInAsN bulk layer 80 is grown on and along the flat surface 78a and the slanted surface 78b of the GaAs light confining layer 78 by using the MOCVD method such that the thickness of the GaAs light confining layer 78 on the flat surface 78 a is 30 nm.

As described above, the GaInAsN bulk layer 80 on the flat surface 78a of the GaAs light confining layer 78 becomes the $Ga_{0.93}In_{0.07}As_{0.975}N_{0.025}$ layer 80a having the band-gap wavelength ($\lambda$ g) of 1.24 $\mu$m. The GaInAsN bulk layer 80 on the (111)A plane 78b of the GaAs light confining layer 78 becomes the $Ga_{0.93}In_{0.07}As_{0.965}N_{0.035}$ layer 80b having the increased N content and the band-gap wavelength (Ag) of 1.38 $\mu$m.

Figure 4D:
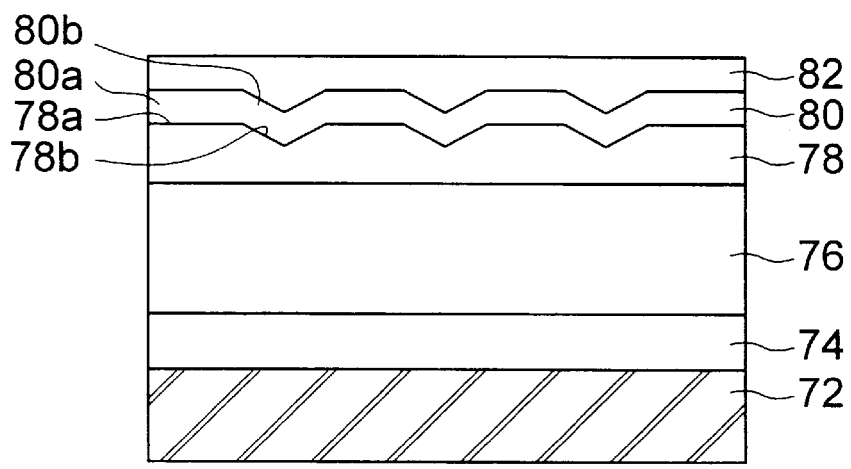

Then, as shown in FIG. 4D, the GaAs light confining layer 82 having the thickness of 50 nm is grown on the GaInAsN bulk layer 80 and flattened.

Figure 4E:
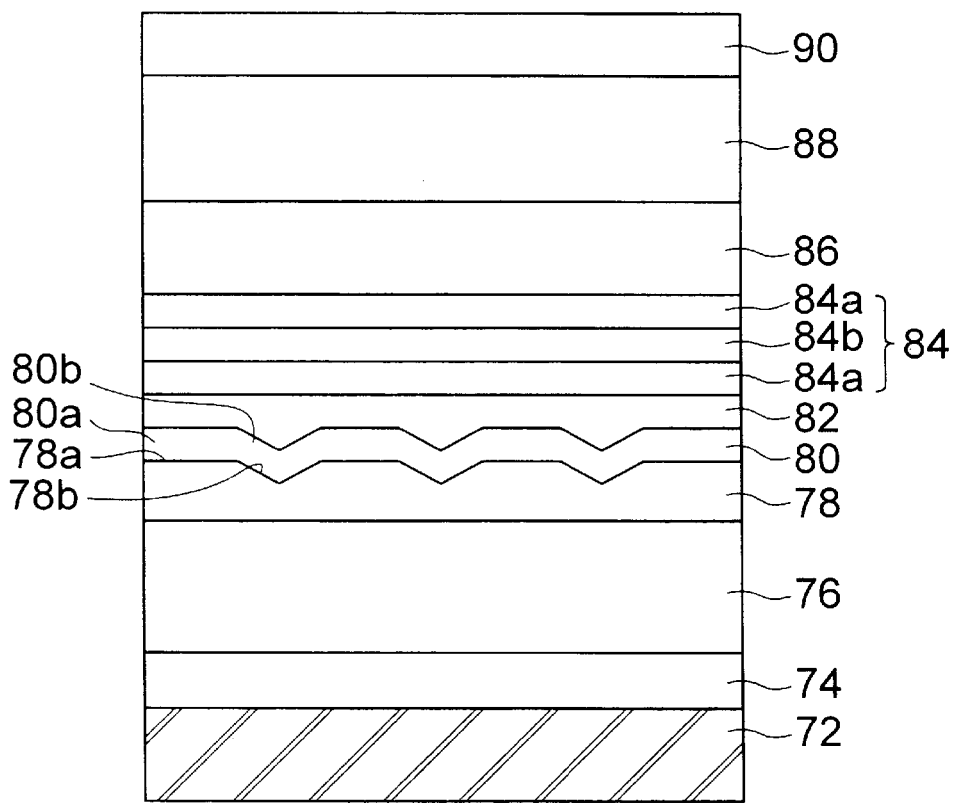

Next, as shown in FIG. 4E, the GaInAsN/GaAs quantum well structure layer 84 is formed on the GaAs light confining layer 82 by sequentially depositing the $Ga_{0.63}In_{0.37}Ns_{0.01}As_{099}$ well layer 84a having the thickness of 8 nm and the compressive strain of 2.5%, the GaAs barrier layer 84b having the thickness of 15 nm and the well layer 84a.

Further, the GaAs light confining layer 86 having the thickness of 140 nm, the p-$Al_{0.5}Ga_{0.5}As$ cladding layer 88 having the thickness of 2 $\mu$m, and the p-GaAs contact layer 90 having a thickness of 0.2 $\mu$m are sequentially grown on the quantum well structure layer 84.

The ridge waveguide-type laser structure having the active layer width of 3 $\mu$m as shown in FIG. 3 is obtained by the photolithographic and mesa etching treatments.

The p-type ohmic metal film made of Au—Zn or Ti/Pt/Au as the p-side electrode is formed. After the bottom surface of the n-GaAs substrate 52 is polished to adjust the thickness to 100 $\mu$m, the AuGe/Ni/Au metal film is deposited on the bottom surface of the n-GaAs substrate 52 to form the n-side electrode 68.

The cavity length is 300 $\mu$m, and both the facets are the cleavage surfaces.

The protocol DFB laser 70 of the present embodiment was fabricated, and an optical output-injection current performance thereof was measured. Threshold current at 25° C. is as low as 12 mA, and the threshold temperature characteristic between 25 and 85° C. included a characteristic temperature To as high as 180K.

The lasing spectrum showed the vertical single mode operation with the side mode suppressing ratio (SMSR) of about 40 dB.

The product yield of the DFB laser showing the excellent single mode lasing was as high as 85%.

Then, the configuration of a distributed feedback semiconductor laser device in accordance with the third invention will be described.

Different from the embodiment of the second invention, a diffraction grating of the present embodiment of the third invention includes a GaInNAs layer having band-gap energy larger than that of the active layer by 40 meV or less and being translucent with respect to a laser emission wavelength of the active layer, and a GaInNAs layer transparent with respect to the laser emission wavelength of the active layer.

Except for the composition of the diffraction grating, the DFB laser of the present embodiment includes substantially same configuration as that of the DFB laser of the embodiment of the second invention.

The diffraction grating of the present embodiment are formed by a $Ga_{0.94}In_{0.06}As_{0.979}N_{0.021}$ layer having a thickness of 30 nm and a band-gap wavelength of 1.15 $\mu$m and being lattice-matched with a GaAS substrate and formed on a flat surface 78a of (100) plane of a GaAs light confining layer 78, and a $Ga_{0.94}In_{0.06}As_{0.972}N_{0.028}$ layer with an increased N content formed on a slanted surface 78b of (111)A plane.

The $Ga_{0.94}In_{0.06}AS_{0.972}N_{0.028}$ layer has a tensile strain of 0.2% with respect to an n-GaAs substrate, and a band-gap wavelength of 1.25 $\mu$m smaller than a laser emission wavelength of an active layer.

Since the $Ga_{0.94}In_{0.06}As_{0.979}N_{0.021}$ layer on the (100) plane acts as a transparent layer and the $Ga_{0.94}In_{0.06}As_{0.972}N_{0.028}$ layer on the (111)A plane acts as a translucent layer with respect to the laser emission wavelength of 1.3 $\mu$m of the active layer in the present embodiment, the absorption-type distributed feedback semiconductor laser device can be realized including the diffraction grating having the transparent layers and the translucent layers alternately disposed.

Although the diffraction grating of the above embodiments of the second and the third inventions is formed by the absorption layer or the translucent layer on the (111)A plane, a GaInNAs absorption layer or a GaInNAs translucent layer may be used to make the grating on the (N11)A plane, where N is integar.

Although the In content of the well layer 84a is 0.37 in the embodiments of the second and the third inventions, the In content may be any value from 0 to 0.5, thereby changing the laser emission wavelength of the active layer from 0.9 to 1.65 $\mu$m.

In this case, however, the composition of the absorption layer should be modified such that the band-gap wavelength of the absorption layer has the above relation with the laser emission wavelength of the active layer.

The number of the quantum wells may be changed between 1 and 15 different from the embodiments of the second and the third inventions in which the number is two.

A GRIN (Graded Index)-SCH structure using $Al_xGa_{1-x}As$ can be used in place of the SCH structure using the GaAs light confining layer in the embodiments of the second and the third inventions.

A buried hetero (BH) structured stripe laser or a TJS (Transverse Junction Stripe) laser can be used in place of the ridge waveguide-type distributed feedback semiconductor laser device in the embodiments of the second and the third inventions.

Although the DFB semiconductor laser device having the wavelength band of 1300 nm is exemplified in the embodiments of the second and the third inventions, the present invention may be applied to lasers having wavelength bands of 980 nm, 1480 nm, 1550 nm and 1650 nm by adjusting the composition of the active layer.

A GaInNAsSb quantum well layer and a GaInNAsSb absorption layer may be used in place of the GaInAs quantum well layer 56 and the GaInNAs absorption layer 58, respectively, in the embodiment of the first invention. Both of the Sb contents in the GaInNAsSb quantum well layer and in the GaInNAsSb absorption layer are preferably between 0.2 and 3.5% with respect to the group V metals.

A GaInNAsSb/GaAs quantum well structure layer and a GaInNAsSb absorption layer may be used in place of the GaInNAs/GaAs quantum well structure layer 84 and the GaInNAs absorption layers 80a,80b, respectively, in the embodiment of the second invention. Both of the Sb contents in the GaInNAsSb/GaAs quantum well layer and in the GaInNAsSb absorption layers 80a,80b are preferably between 0.2 and 3.5% with respect to the group V metals.

A GaInNAsSb absorption layer may be used in place of the $Ga_{0.94}In_{0.06}As_{0.979}N_{0.021}$ layer and/or the $Ga_{0.94}In_{0.06}As_{0.972}N_{0.028}$ layer forming the diffraction grating in the embodiment of the third invention.

In this case, the GaInNAsSb in the translucent layer on the (111) plane preferably has band-gap energy larger than that of the active layer by 40 meV or less, and the Sb content therein is preferably between 0.2 and 3.5% with respect to the group V. The layer on the (100) plane automatically becomes transparent with respect to the active layer.

The GaInNAsSb layer may be used in the embodiments of the modification case in the second and the third invention.

In the embodiments of the second and the third inventions, a phenomenon in which the increase of the amount of the "N" incorporation is utilized which occurs by forming the substrate with steps having the (111)A plane and growing the GaInNAs on the (111)A plane.

Figure 5:
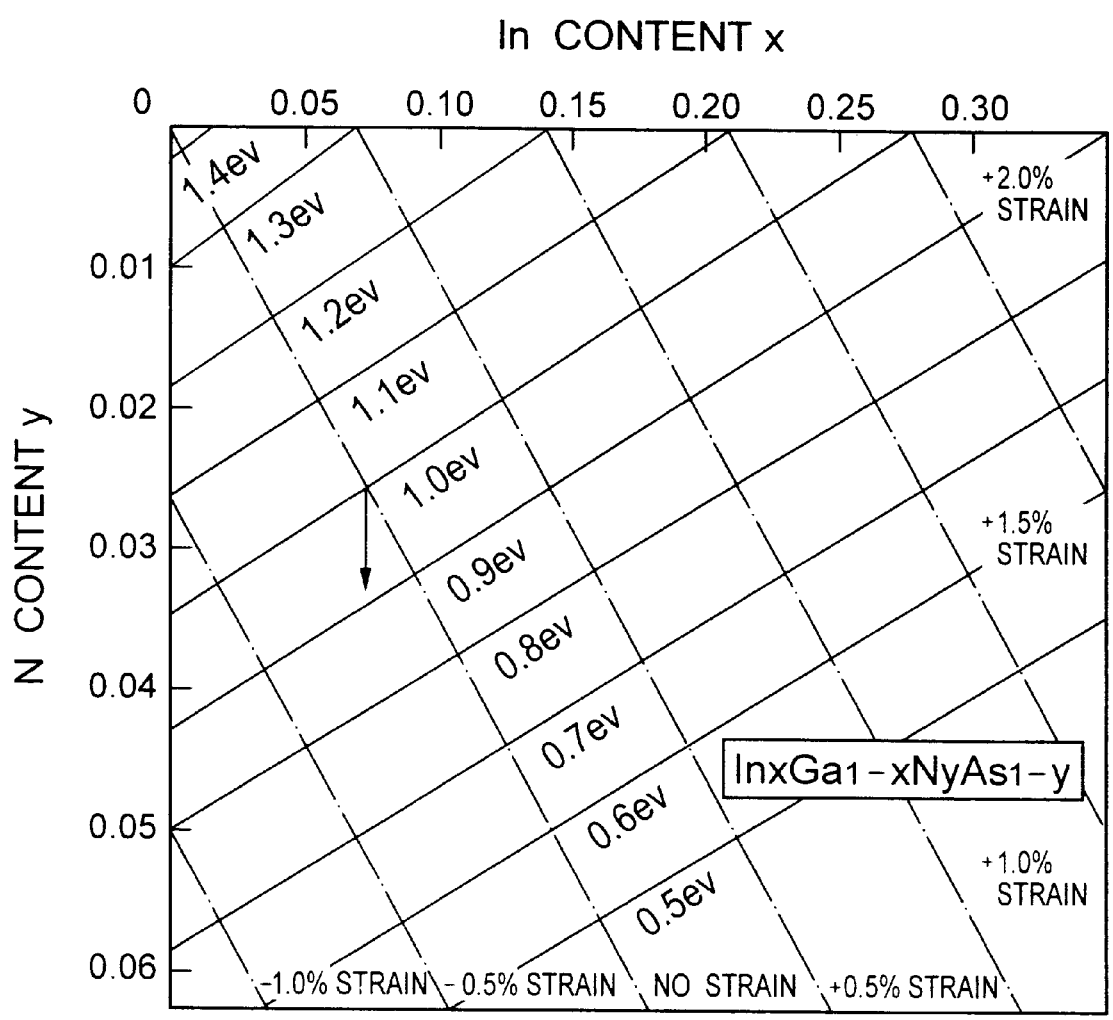
FIG. 5 is a graph showing a relation between a mixed crystal composition of GaInNAs, and strain and band-gaps.

The GaInAsN layer is grown on the flat surface as a $Ga_{0.93}In_{0.07}As_{0.975}N_{0.025}$ layer having a band-gap wavelengh of 1.24 μm and being lattice-matched with the n-GaAS substrate based on the relation between the mixed crystal composition of the GaInNAs, and the strain and the bandgaps shown in a graph of FIG. 5. The $Ga_{0.93}In_{0.07}As_{0.965}N_{0.035}$ layer having the increased N content is grown on the (111)A plane. The relation shown in FIG. 5 is recited from JP-A-8(1996)-195522 prepared by Masahiko KONDOW et.al.

The $Ga_{0.93}In_{0.07}As_{0.965}N_{0.035}$ layer on the (111)A plane has a tensile strain of 0.2% with respect to the n-GaAs substrate, the higher N content and a band-gap wavelength of 1.38 μm, and acts as an absorption layer with respect to 1.3 μm of the active layer. On the other hand, the $Ga_{0.93}In_{0.07}As_{0.975}N_{0.025}$ layer acts as a transparent layer. In this manner, the diffraction grating having the transparent layers and the absorption layers can be formed.

Since the above embodiment is described only for examples, the present invention is not limited to the above embodiment and various modifications or alterations can be easily made therefrom by those skilled present invention.

What is claimed is:

1. A distributed feedback (DFB) semiconductor laser device comprising:

a semiconductor substrate; and an active layer and a diffraction grating overlying the semiconductor substrate, the diffraction grating having a composition of GaInNAs (Sb) and absorbing light having a laser emission wavelength of the active layer.

2. The DFB semiconductor laser device as defined in claim 1, wherein the semiconductor substrate is made of GaAs, and the active layer has a quantum well structure layer including a Ga(In)As well structure.

3. The DFB semiconductor laser device as defined in claim 1, wherein the semiconductor substrate is made of GaAs, and the active layer has a quantum well structure layer including a GaInNAs(Sb).

4. A DFB semiconductor laser device comprising:

a GaAs substrate;

a quantum well structure including a GaInNAs(Sb) quantum well layer acting as an active layer; and an absorption layer including a diffraction grating made of GaInNAs(Sb) having a band-gap energy which is lower than that of the GaInNAs(Sb) quantum well layer.

5. A DFB semiconductor laser device comprising:

a GaAs substrate;

a quantum well structure including a GaInNAs(Sb) quantum well layer acting as an active layer; and an absorption layer including a diffraction grating made of GaInNAs(Sb) having a band-gap energy which is larger than that of the GaInNAs(Sb) quantum well layer by 40 meV or less.

6. The DFB semiconductor laser device as defined in claim 4, wherein the absorption layer is made of GaInNAs (Sb) formed on an (N11)A plane of a substrate having steps (N is an integer).

7. The DFB semiconductor laser device as defined in claim 6, wherein the absorption layer is made of GaInNAs (Sb) formed on an (111)A plane of a substrate having steps and alternately including a (111) plane and a (100) plane.

* * * * *